United States Patent
Pancholi et al.

(10) Patent No.: US 9,438,164 B2
(45) Date of Patent: Sep. 6, 2016

(54) SYSTEM AND METHOD FOR CALIBRATING CAPACITOR-BASED OSCILLATORS IN CRYSTAL-LESS DEVICES

(71) Applicant: SanDisk Technologies Inc., Plano, TX (US)

(72) Inventors: Deepak Pancholi, Bangalore (IN); Bhavin Odedara, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/541,863

(22) Filed: Nov. 14, 2014

(65) Prior Publication Data

US 2015/0188491 A1 Jul. 2, 2015

(30) Foreign Application Priority Data

Dec. 30, 2013 (IN) .......................... 6160/CHE/2013

(51) Int. Cl.
*H03B 5/12* (2006.01)
*H03B 5/02* (2006.01)

(52) U.S. Cl.
CPC .............. *H03B 5/1228* (2013.01); *H03B 5/02* (2013.01); *H03B 5/1215* (2013.01); *H03B 5/1265* (2013.01); *H03J 2200/09* (2013.01); *H03J 2200/10* (2013.01)

(58) Field of Classification Search
CPC ............................... H03B 5/12; H03B 5/1228
USPC ............................................ 331/117 R, 167
See application file for complete search history.

(56) References Cited

U.S. PATENT DOCUMENTS

| 7,375,594 | B1 | 5/2008 | Lemkin et al. | |
| 8,570,107 | B2 * | 10/2013 | Guo | H03L 7/103 327/156 |
| 8,587,384 | B2 * | 11/2013 | Satoh | H03L 1/025 331/117 R |
| 2007/0001775 | A1 | 1/2007 | Song | |
| 2008/0150641 | A1 * | 6/2008 | Costa | H03L 7/099 331/16 |
| 2010/0122106 | A1 * | 5/2010 | Lee | G06F 1/12 713/503 |
| 2013/0331040 | A1 | 12/2013 | Harnishfeger et al. | |

FOREIGN PATENT DOCUMENTS

CN 102346499 A 2/2012
WO WO 2010/025563 A1 3/2010

OTHER PUBLICATIONS

International Search Report and Written Opinion of corresponding International Patent Application No. PCT/US2014/071125 dated Mar. 10, 2015.

* cited by examiner

*Primary Examiner* — Jeffrey Shin
(74) *Attorney, Agent, or Firm* — Brinks Gilson & Lione

(57) ABSTRACT

A method for calibrating an oscillator in an electronic device and an electronic device configured for calibration are provided. Multiple signals are sent to the electronic device from another electronic device, such as from a host device. With knowledge of the time interval between the multiple signals, the electronic device may calibrate the oscillator in the electronic device. For example, the electronic device may be a USB-compliant electronic device. The USB-compliant electronic device may receive Start of Frame (SoF) signals from a host device, which in one USB implementation is received at 1 mSec intervals. The USB-compliant electronic device may count the output of the oscillator between receipt of different SoF signals in order to determine the frequency of the oscillator at different oscillator settings.

20 Claims, 10 Drawing Sheets

SYSTEM AND METHOD FOR CALIBRATING CAPACITOR-BASED OSCILLATORS IN CRYSTAL-LESS DEVICES

REFERENCE TO RELATED APPLICATION

This application claims the benefit of Indian Patent Application No. 6160/CHE/2013, filed on Dec. 30, 2013, the entirety of which is incorporated by reference herein.

TECHNICAL FIELD

This application relates generally to capacitor-based oscillators. More specifically, this application relates to calibrating capacitor-based oscillators in crystal-less devices.

BACKGROUND

Electronic devices typically operate based on precise frequencies. The precise frequencies may be used to provide a stable clock signal for integrated circuits, or may be used to stabilize frequencies for radio transmitters and receivers. One way to generate a precise frequency is by using a crystal oscillator. The crystal oscillator is an electronic oscillator circuit that uses the mechanical resonance of a vibrating crystal to create an electrical signal with the precise frequency.

However, crystal oscillators may prove too expensive for certain electronic devices. For example, USB peripheral electronic devices may be more cost-sensitive, with the crystal oscillators adding too much cost to the bill of materials. In this regard, electronic devices may generate the frequency without using a crystal, such as by using an L-C oscillator, R-C oscillator or the like.

BRIEF SUMMARY

A method for calibrating an oscillator in an electronic device and an electronic device configured for calibration are provided. In one aspect, a method for calibrating an oscillator in an electronic device, in which the electronic device is configured to communicate with an external device via an interface, the oscillator is configurable to a plurality of settings, with each of the settings resulting in a different frequency output by the oscillator, is provided. The method includes: iteratively performing for the plurality of settings: configuring the oscillator to a respective setting; receiving a first periodic signal from the electronic device via the interface; receiving a second periodic signal from the electronic device via the interface; and determining a number of cycles output from the oscillator at the respective setting in between when the first periodic signal was received and the second periodic signal was received. The method further includes selecting one of the plurality of settings to configure the oscillator based on the determined number of cycles output from the oscillator at the respective settings.

In another aspect, an electronic device configured to calibrate a oscillator is provided. The electronic device includes: an interface configured to communicate with an external device; an oscillator configurable to a plurality of settings, each of the settings resulting in a different frequency output by the oscillator; and a controller in communication with the interface and the oscillator. The controller is configured to iteratively perform for the plurality of settings: configure the oscillator to a respective setting; receive a first periodic signal from the electronic device via the interface; receive a second periodic signal from the electronic device via the interface; and determine a number of cycles output from the oscillator at the respective setting in between when the first periodic signal was received and the second periodic signal was received. The controller is further configured to select one of the plurality of settings to configure the oscillator based on the determined number of cycles output from the oscillator at the respective settings.

Other features and advantages will become apparent upon review of the following drawings, detailed description and claims. Additionally, other embodiments are disclosed, and each of the embodiments can be used alone or together in combination. The embodiments will now be described with reference to the attached drawings.

BRIEF DESCRIPTION OF THE DRAWINGS

The system may be better understood with reference to the following drawings and description. In the figures, like reference numerals designate corresponding parts throughout the different views.

DETAILED DESCRIPTION

Figure 1:
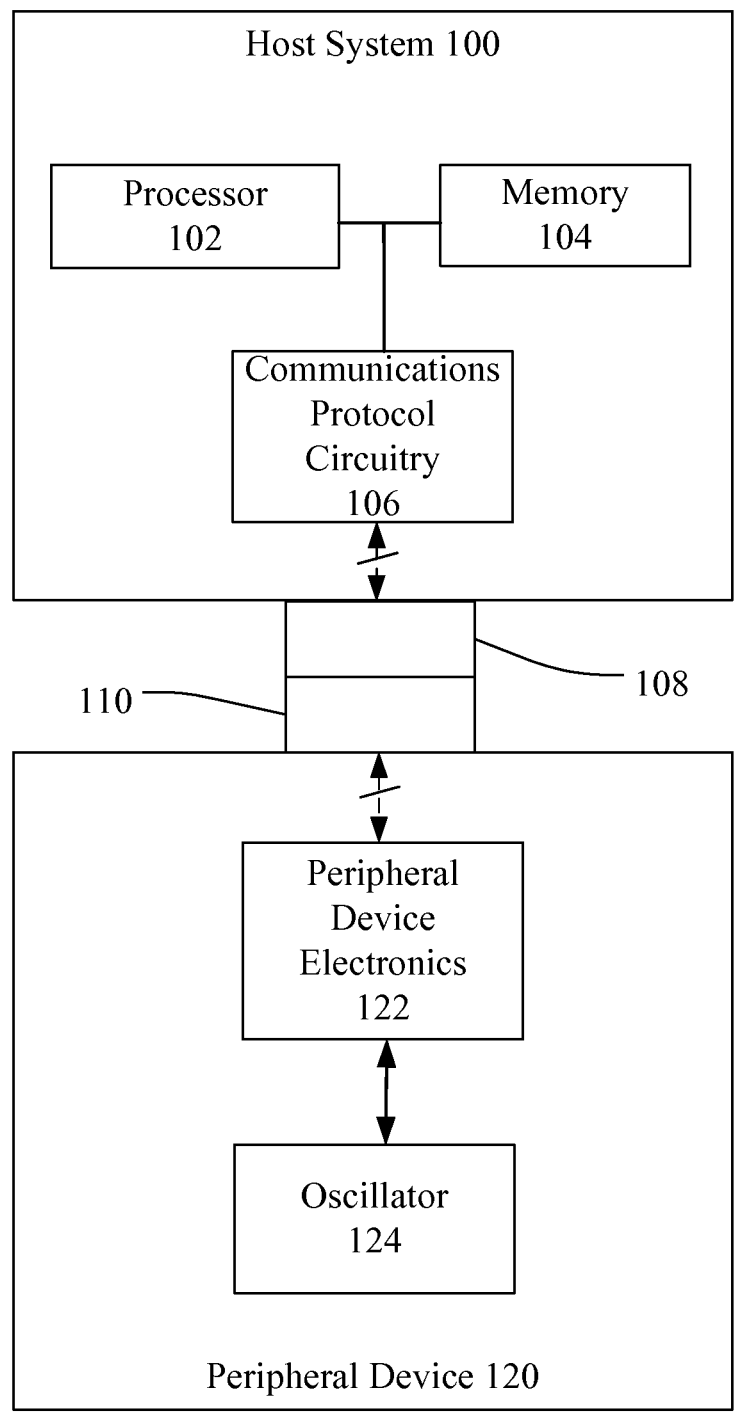
FIG. 1 illustrates a block diagram of a host system and a peripheral device.

An electronic device may operate using one or more precise frequencies. One way to generate the precise frequency is by using an oscillator, such as a capacitor-based oscillator. As discussed in more detail below, the capacitor-based oscillator may comprise, for example, an inductor-capacitor (LC) oscillator or a resistor-capacitor (RC) oscillator. More specifically, the RC oscillator is configured to generate an oscillating signal without using a crystal.

However, the frequency output by the oscillator, such as the capacitor-based oscillator, may be dependent on various factors, including, without limitation, any one, any two, or all of the following: process, voltage, and/or temperature. For example, for any type of oscillator, such as an LC oscillator or an RC oscillator, the output frequency may vary with process or with silicon die-to-die. In this regard, calibration of the capacitor-based oscillator may be performed.

In one embodiment, calibration of the oscillator, such as the capacitor-based oscillator, is based on a signal received from an external electronic device. In a more specific embodiment, the oscillator may be resident in a peripheral device (such as a peripheral storage device). A host device, to which the peripheral device is connected, may send one or more signals to the peripheral device. The one or more signals sent to the peripheral device may be used by the peripheral device to calibrate the capacitor-based oscillator resident on the peripheral device, as discussed in more detail below.

A first signal and a second signal may be sent from the host device to the peripheral device. In one embodiment, the time interval between sending the first signal and the second signal may be predetermined (e.g., known to the peripheral device prior to sending one or both of the first signal and second signal). As discussed in more detail below, different communication protocols, such as USB 2.0 and USB 3.0 send signals at periodic intervals. One example of Start-of-Frame (SoF) packets, in which SoF packets are transmitted from the host device every 1 mSec in USB 2.0 full speed mode and 125 μSec in USB 2.0 high speed mode. Another example is isochronous time-step packets (ITP) sent for USB 3.0. The peripheral device may configure the oscillator into one configuration (e.g., in an L-C oscillator, selecting a particular capacitor setting). The peripheral device may then count the number of edges of the oscillator (or count another aspect of the output of the oscillator) in the one configuration from the first rising edge of the first signal (e.g., a SoF packet or a ITP) to the rising edge of the second signal (e.g., the next SoF packet received or the next ITP received). Given that the peripheral device has knowledge that the signals have a predetermined time interval and given the counting performed between the first and second signal, the peripheral device may determine the frequency of the oscillator at the one configuration, as discussed in more detail below.

As discussed in more detail below, the terms "first signal" and "second signal" are used. In one embodiment, the "first signal" may comprise the first signal in a sequence of signals sent (such as the first SoF packet sent). In an alternate embodiment, the "first signal" may not comprise the first signal in a sequence of signals sent (such as a SoF packet sent after the first SoF packet). Further, in one embodiment, the "second signal" may be the next signal received after receipt of the first signal (such as the next SoF packet sent after the SoF packet designated as the first signal). In an alternate embodiment, the "second signal" may not be the next signal received after receipt of the first signal. Regardless, the peripheral device may have knowledge of an amount of time between receipt of the first signal and the second signal, thereby determining a frequency of the oscillator at a selected calibration setting.

In an alternate embodiment, the time interval between sending the first signal and the second signal may not be known to the peripheral device prior to sending one or both of the first signal and second signal. For example, the host device may send the first signal, the second signal, and information indicative of the time interval between the first signal and the second signal. More specifically, the host device may send information indicating that the time interval between the first signal and the second signal is 100 μSec. The information may be sent separately from the first signal and the second signal, may be contained within the first signal, or may be contained within the second signal.

The peripheral device may configure the oscillator into one configuration (e.g., in an L-C oscillator, selecting a particular capacitor setting). The peripheral device may then count the number of edges of the oscillator (or count another aspect of the oscillator) in the one configuration from the first rising edge of the first signal to the rising edge of the second signal. Given that the peripheral device has knowledge of the time interval between the two signals (based on the information indicative of the time interval between the first signal and the second signal) and given the counting performed between the first and second signal, the peripheral device may determine the frequency of the oscillator at the one configuration.

The calibration of the oscillator may be performed at various times. In one embodiment, the calibration may be performed contemporaneously with each use of the oscillator. For example, the calibration may be performed upon connection of the peripheral device with the host device. In an alternate embodiment, the calibration may be performed each time upon power up of the peripheral device. In still an alternate embodiment, the calibration may be performed at a prior time (such as prior to connection of the peripheral device with the host device). The prior calibration may be stored in a memory (such as in the flash memory of the peripheral storage device) in the form of a look-up table. As described above, the oscillator may vary based on voltage and temperature. In this regard, the calibration may be used to generate a look-up table that correlates voltage and/or temperature with settings of the oscillator. In operation, the current voltage and/or current temperature may be input to the look-up table, with the look-up table outputting the oscillator's setting (e.g., capacitor settings) in order to obtain the desired frequency of the oscillator.

FIG. 1 illustrates a block diagram of a host system 100 and a peripheral device 120. The host system 100 includes a processor 102, a memory 104, and communication protocol circuitry 106. The processor 102 may include one or more general processors, controllers, application specific integrated circuits, field programmable gate arrays, digital circuits, optical circuits, analog circuits, combinations thereof, or other now known or later-developed devices for analyzing and processing data. The memory 104 may comprise volatile and/or non-volatile memory for storing data and/or instructions for execution by the processor 102.

Communication protocol circuitry 106 may comprise circuitry in order for the host device 100 to communicate with peripheral device 120. For example, the communication protocol circuitry 106 may comprise a Universal Serial Bus (USB) communication protocol. The USB communication protocol comprises a standard by which devices may communicate, such as a host device and a peripheral device. The processor 102 may access instructions in memory 104 in order to configure communications to comport with the communication protocol and may use communication protocol circuitry 106 in order to transmit the communications to the peripheral device 102. Mating parts 108, 110 may comprise mechanical and/or electrical connectors, thereby facilitating communication between host system 100 and peripheral device 120.

Peripheral device 120 comprises peripheral device electronics 122 and an oscillator 124. The peripheral device electronics 122 may comprise calibration functionality in order to calibrate oscillator 124, as discussed in more detail below.

Figure 2:
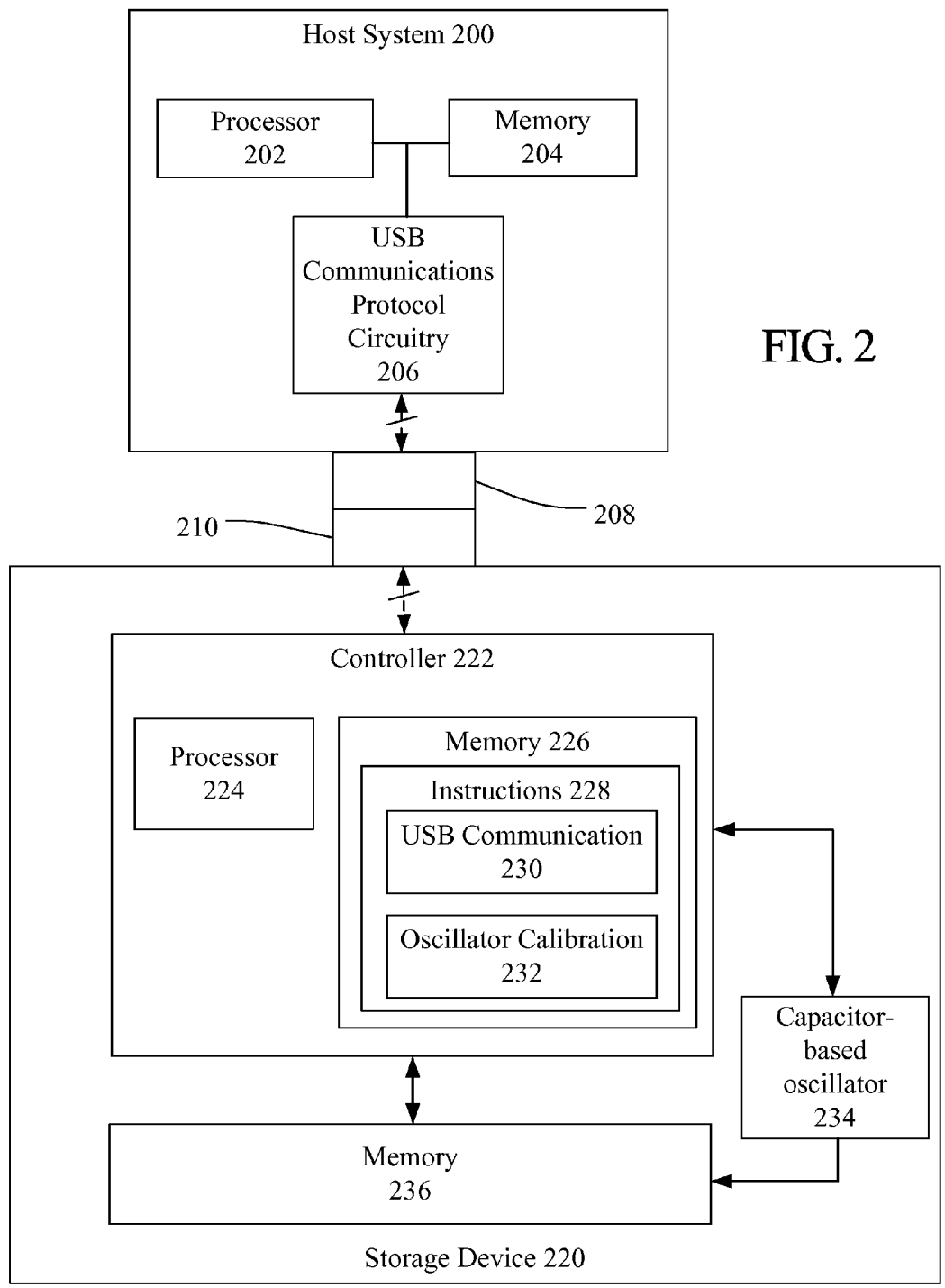
FIG. 2 illustrates a block diagram of a host system and a storage device.

FIG. 2 illustrates a block diagram of a host system 200 and a storage device 220. The host system 200 includes a processor 202, a memory 204, and USB communications protocol circuitry 206. Processor 202 may be similar or identical to processor 102. Further, memory 204 may be similar or identical to memory 104. USB communications protocol circuitry 206 may comprise circuitry, such as driver circuitry, in order for the host device 200 to communicate with storage device 220. The processor 202 may access instructions in memory 204 in order to configure communications to comport with the USB communication protocol and may use USB communication protocol circuitry 206 in order to transmit the communications to the storage device 220.

The host system 200 of FIG. 2 stores data into and retrieves data from storage device 220. The storage device 220 may be flash memory embedded within the host, such as in the form of a solid state disk (SSD) drive installed in a personal computer. Alternatively, the storage device 220 may be in the form of a card that is removably connected to the host system 200 through mating parts 208 and 210 of a mechanical and electrical connector as illustrated in FIG. 2. A flash memory configured for use as an internal or embedded SSD drive may look similar to the schematic of FIG. 2, with the primary difference being the location of the storage device 220 internal to the host system 200. SSD drives may be in the form of discrete modules that are drop-in replacements for rotating magnetic disk drives.

The storage device 220 of FIG. 2 may include a controller 222, a memory 236, and a capacitor-based oscillator 234. The controller 222 is represented as including a processor 224 and a memory 226. The controller 222 may include one or more general processors, controllers, application specific integrated circuits, field programmable gate arrays, digital circuits, optical circuits, analog circuits, combinations thereof, or other now known or later-developed devices for analyzing and processing data. The memory 226 may comprise volatile and/or non-volatile memory. Further, the memory 226 may include instructions 228. The instructions 228 may be accessed and executed by processor 224 in order for the storage device 220 to include the functionality described herein. For example, instructions 228 may include USB communication instructions 230, execution of which is used to enable the storage device 220 to communicate with the host system 200 via the USB communication protocol. As another example, instructions 228 may include oscillator calibration instructions 232, execution of which is used to enable the storage device 220 to calibrate the capacitor-based oscillator 234, as described below. Though not shown, memory 226 may further store a table representing calibration values. As discussed above, a prior calibration of the capacitor-based oscillator 234 may be stored in a memory, such as in memory 226, in the form of a look-up table. The look-up table may correlate different variables, such as voltage and/or temperature, with the capacitor-based oscillator setting. In operation, the processor 224 may access the look-up table in memory 226 (or in other memory devices, such as an E-fuse or memory 236), input the current voltage and/or current temperature to the look-up table, and receive an output from the look-up table of oscillator's setting (e.g., capacitor settings) in order to obtain the desired frequency of the oscillator. The memory 236 may include non-volatile memory, such as flash memory.

Figure 3:
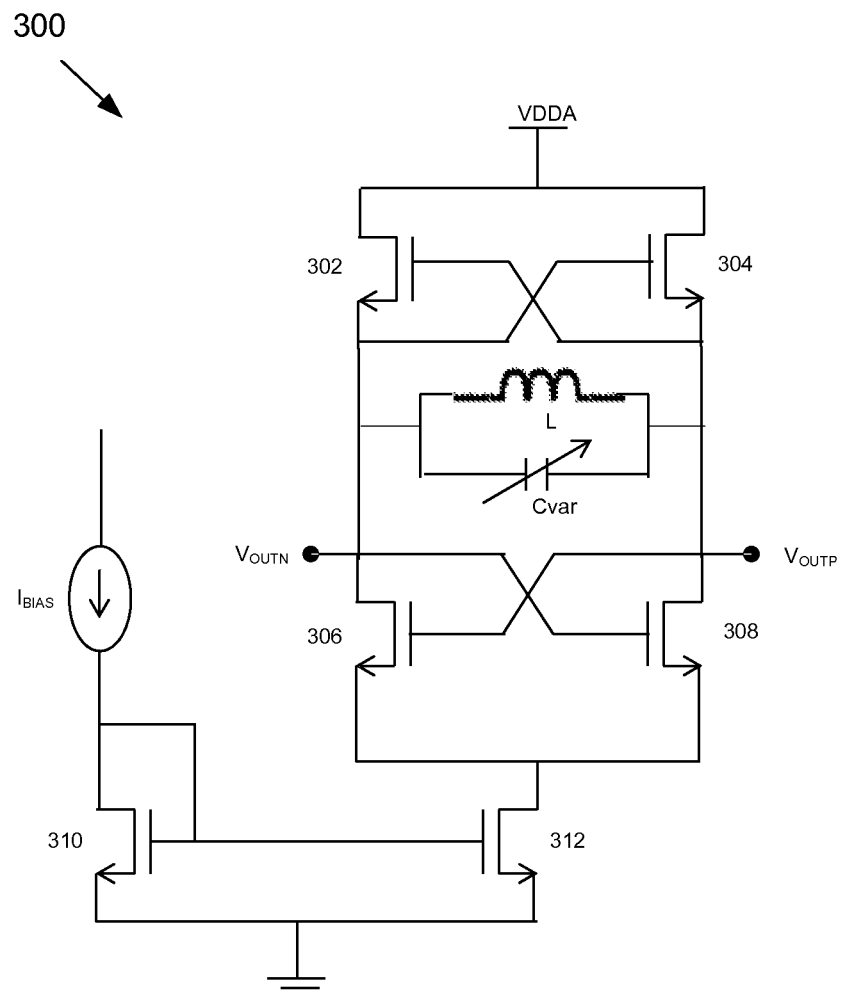
FIG. 3 illustrates a schematic of an exemplary LC oscillator circuit.

FIG. 3 illustrates a schematic of an exemplary LC oscillator circuit 300. LC oscillator circuit 300 includes a current source that generates a bias current ($I_{BIAS}$). $I_{BIAS}$ is sent to a current mirror, so $I_{BIAS}$ that flows through both transistor 310 and transistor 312. The LC oscillator circuit 300 further includes inductor L and variable capacitor Cvar. Transistors 302, 304, 306, and 308 are to configure the LC oscillator circuit 300 so that the output of the oscillator is at nodes $V_{OUTN}$ and $V_{OUTP}$. As discussed in more detail below, Cvar may include different values, such as illustrated in FIG. 4.

Figure 4:
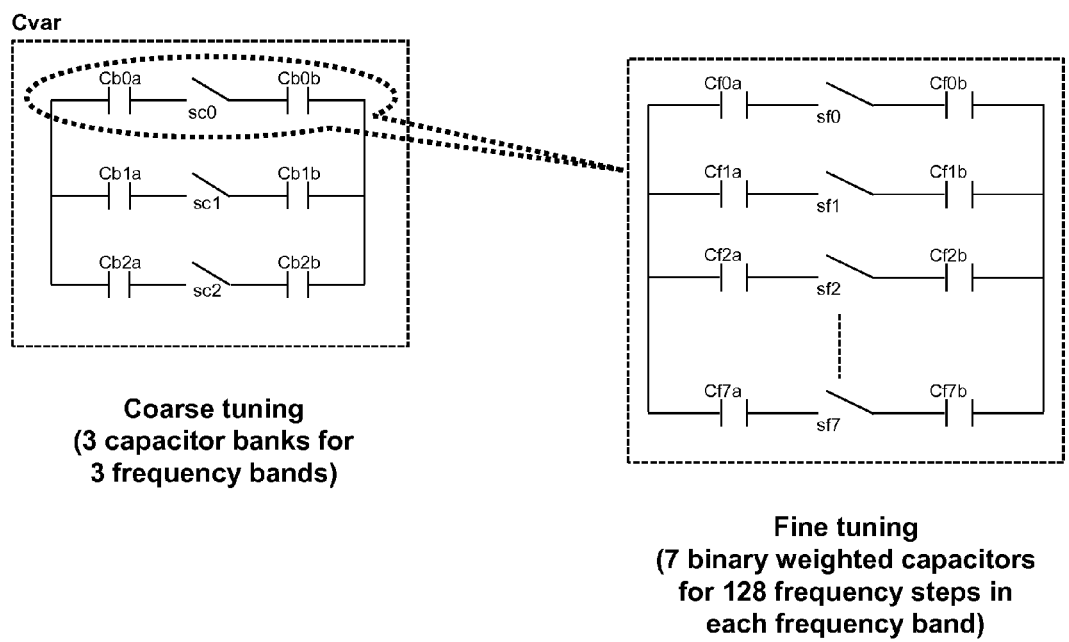
FIG. 4 illustrates an example of capacitor programming in the exemplary LC oscillator circuit of FIG. 3.

FIG. 4 illustrates an example of capacitor programming in the exemplary LC oscillator circuit 300 of FIG. 3. Cvar may include multiple values of the variable capacitor. In one example, Cvar may be composed of coarse-tuned capacitor settings and fine-tuned capacitor settings. For example, FIG. 4 illustrates three coarse-tuned settings and within each of the three coarse-tuned settings, 128 fine-tuned capacitor settings. More specifically, the fine-tuned capacitor settings include 7 binary weight capacitors for 128 frequency steps in each frequency band. FIG. 4 is merely for illustration purposes. Other variable capacitor configurations are contemplated.

Figure 5:
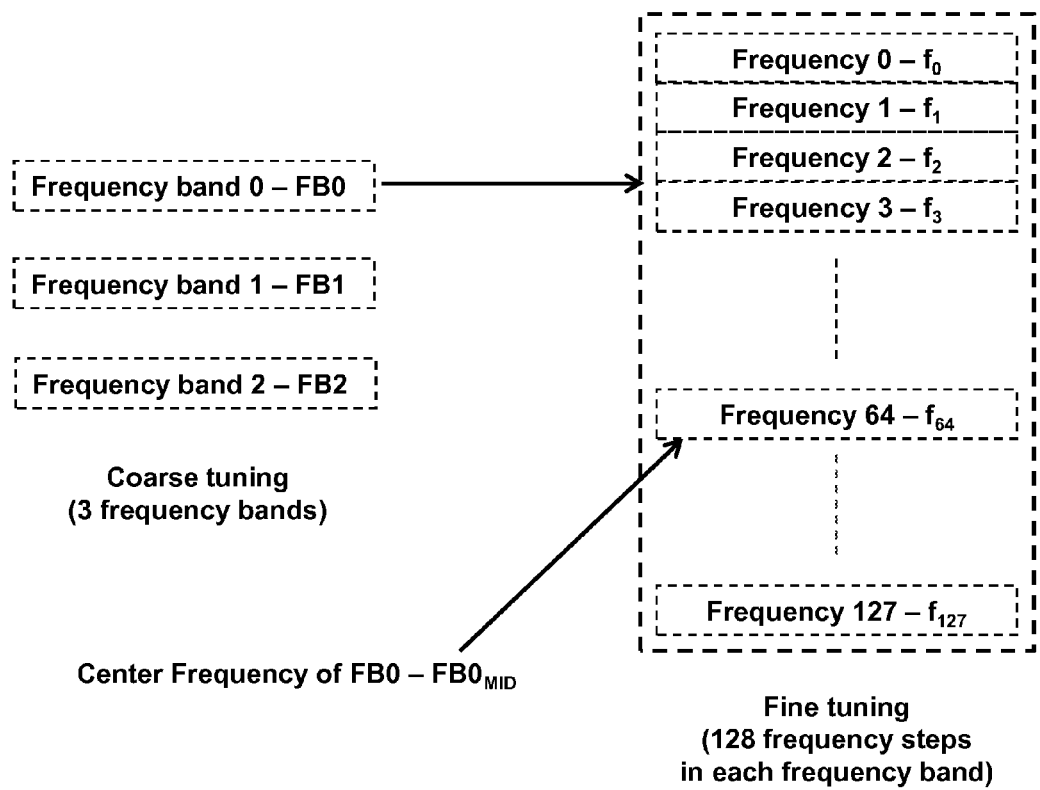
FIG. 5 illustrates frequency programming in the exemplary LC oscillator circuit of FIG. 3.

FIG. 5 illustrates frequency programming in the exemplary LC oscillator circuit 300 of FIG. 3. For example, each of the three coarse-tuned settings corresponds to different frequency bands, such as coarse-tuned setting 0 corresponding to frequency band 0 (FB0), coarse-tuned setting 1 corresponding to frequency band 1 (FB1), and coarse-tuned setting 2 corresponding to frequency band 2 (FB2). Each frequency band may include a plurality of frequencies corresponding to the fine-tuned capacitor settings. For example, the 128 fine-tuned capacitor settings may correspond to 128 frequency steps. Further, center frequency within the 128 fine-tuned frequency steps may comprise frequency 64. Again, FIG. 5 is merely for illustration purposes to shown different frequencies of the capacitor-based oscillator based on the different capacitor settings.

Figure 6A:
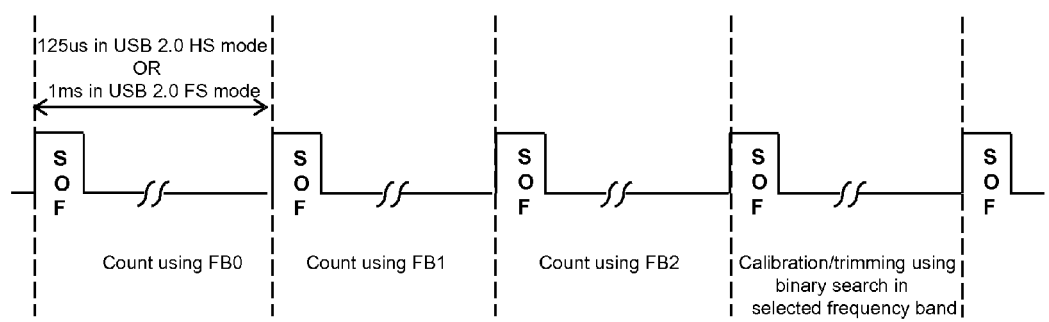
FIG. 6A illustrates frequency trimming during initialization of the link in USB 2.0.

FIG. 6A illustrates frequency trimming during initialization of the link in USB 2.0. As discussed above, one signal comprises the SoF packet. In USB 2.0 high speed (HS) mode, the SoF packet is transmitted every 125 μSec. In USB 2.0 full speed (FS) mode, the SoF packet is transmitted every 1 mSec. The frame may be used as a time frame in which to schedule the data transfers. For example, an isochronous endpoint will be assigned one transfer per frame. In this regard, the device, such as peripheral device 120 or storage device 230, may be aware of this interval between SoF packets in order to calibrate the oscillator.

The peripheral device 120 or storage device 230 may perform calibration in one of several ways. As shown in FIG. 6A, the oscillator is configured at the first coarse-tuned setting, and the output of the oscillator is counted (as represented by count using FB0). Thereafter, the oscillator is configured at the second coarse-tuned setting, and the output of the oscillator is counted (as represented by count using FB1). The oscillator is then configured at the third coarse-tuned setting, and the output of the oscillator is counted (as represented by count using FB2). In this regard, the coarse-tuned setting closest to the desired frequency of the oscillator may be selected for calibration and trimming using a binary search in the selected frequency band, as discussed in more detail below.

Figure 6B:
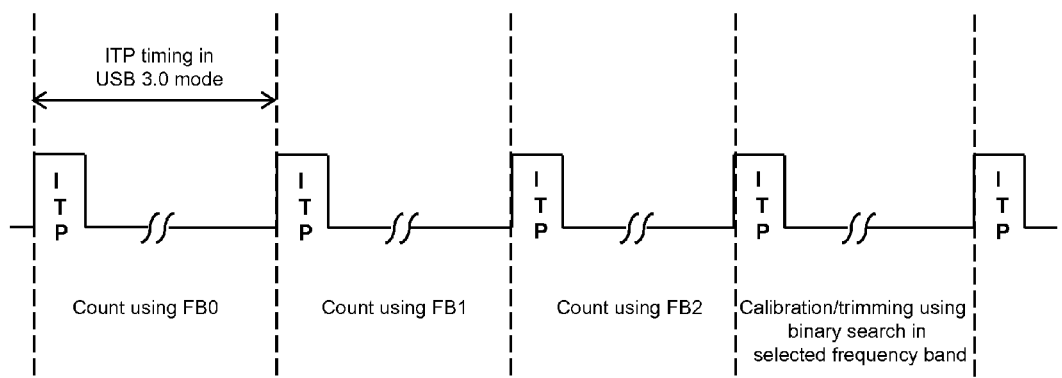
FIG. 6B illustrates frequency trimming during initialization of the link in USB 3.0.

FIG. 6B illustrates frequency trimming during initialization of the link in USB 3.0. ITP is used to multicast timestamp information from the host to one or more active devices. ITPs may be used to provide host timing information for synchronization. The host may transmit the ITP at 125 μSec intervals. Similar to FIG. 6A, the stepping through the various capacitor settings may first examine coarse-tuned settings and then fine-tuned settings. Other signals other than the SoF packet and the ITP are contemplated. For example, in USB, a Keep Alive signal is sent every millisecond, instead of a SoF packet.

Figure 7:
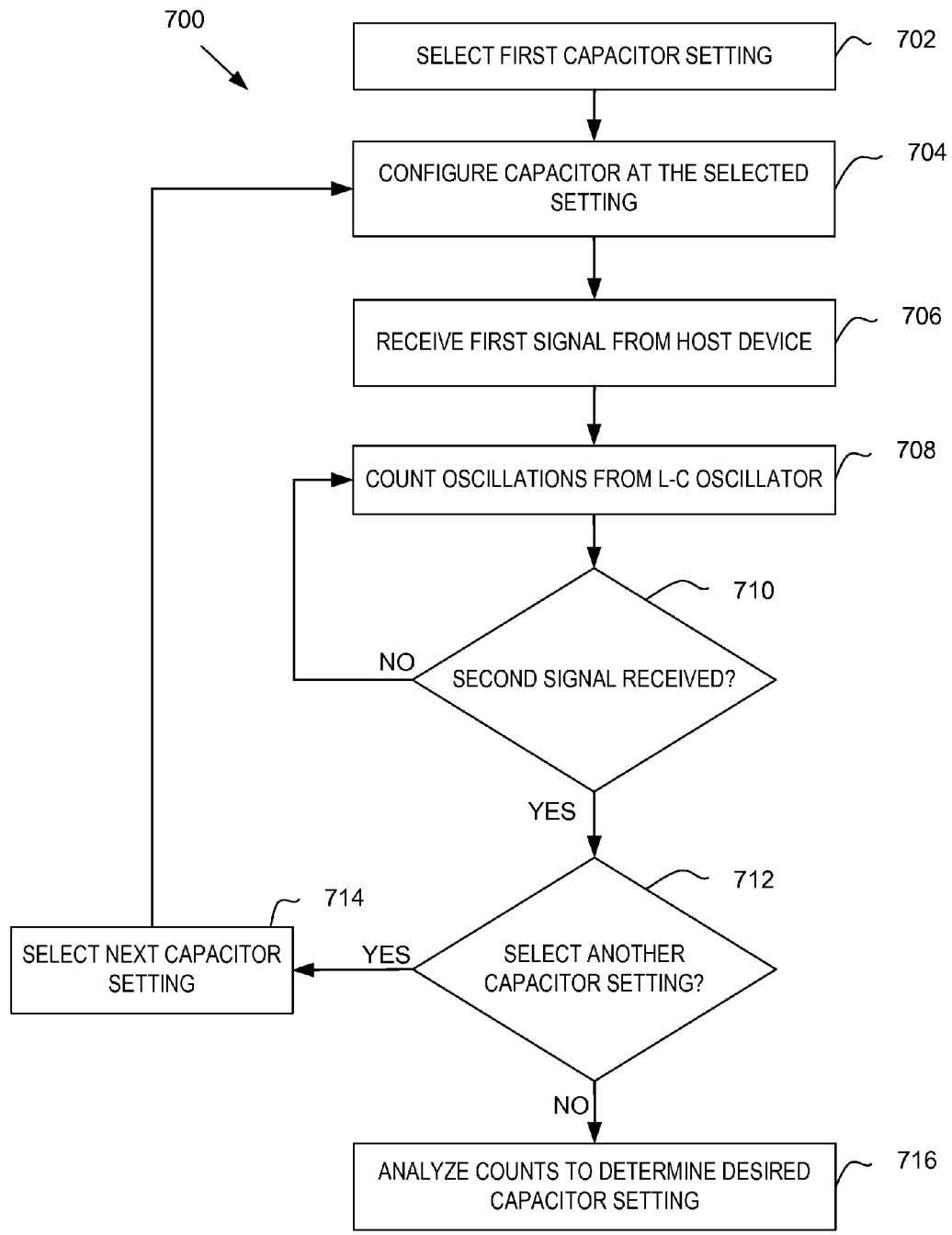
FIG. 7 illustrates a first flow chart for calibrating a capacitor-based oscillator.

FIG. 7 illustrates a first flow chart 700 for calibrating a capacitor-based oscillator. At 702, a first capacitor setting is selected. As discussed above, the variable capacitor may have a plurality of settings, with each setting resulting in a different frequency output from the oscillator. At 704, the capacitor is configured at the selected setting. At 706, the first signal is received. As discussed above, a variety of signals, such as SoF packets, may be received that are indicative of a predetermined time period. At 708, the oscillations output from the oscillator are counted. At 710, it is determined if the second signal has been received. If not, the flow chart 700 loops back to 708. In this regard, the oscillations output from the oscillator are counted until the second signal is received.

At 712, it is determined whether there are other capacitor settings to select. If so, at 714, the next capacitor setting is selected and the flow chart 700 loops back to 704. If not, at 716, the counts are analyzed to determine the desired capacitor setting.

The analysis of the counts at 716 may be performed in one of several ways. One way is to store in a memory, such as memory 226, the number of oscillations that occur in the desired frequency at the time interval between receipt of the first signal and the second signal. As one example, for a 1 GHz desired frequency, 125,000 clock cycles should be counted in the 125 µSec interval between the two successive SoF packets. Likewise, for a 2 GHz desired frequency, 250,000 clock cycles should be counted in that the 125 µSec interval between the two successive SoF packets. As another example, if the time interval between receipt of the first signal and the second signal is 1 mSec and if the desired frequency is 1 MHz, the number of oscillations that occur at 1 MHz in the 1 mSec time period equals 1,000. In this regard, the capacitor setting that results in the counted oscillations closest to 1,000 becomes the selected capacitor setting.

Figure 8A:
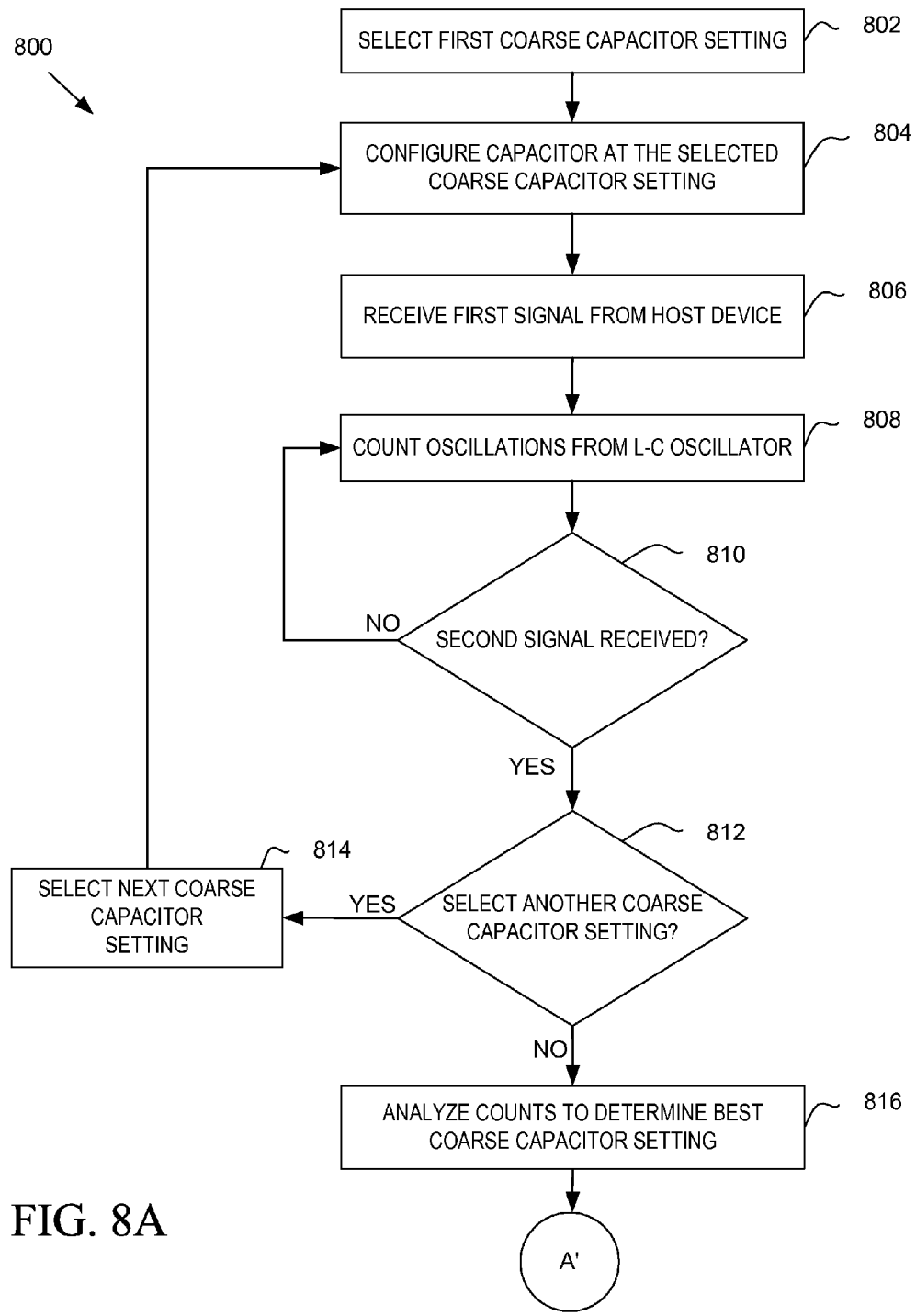
FIGS. 8A-B illustrate a second flow chart for calibrating a capacitor-based oscillator.
Figure 8B:
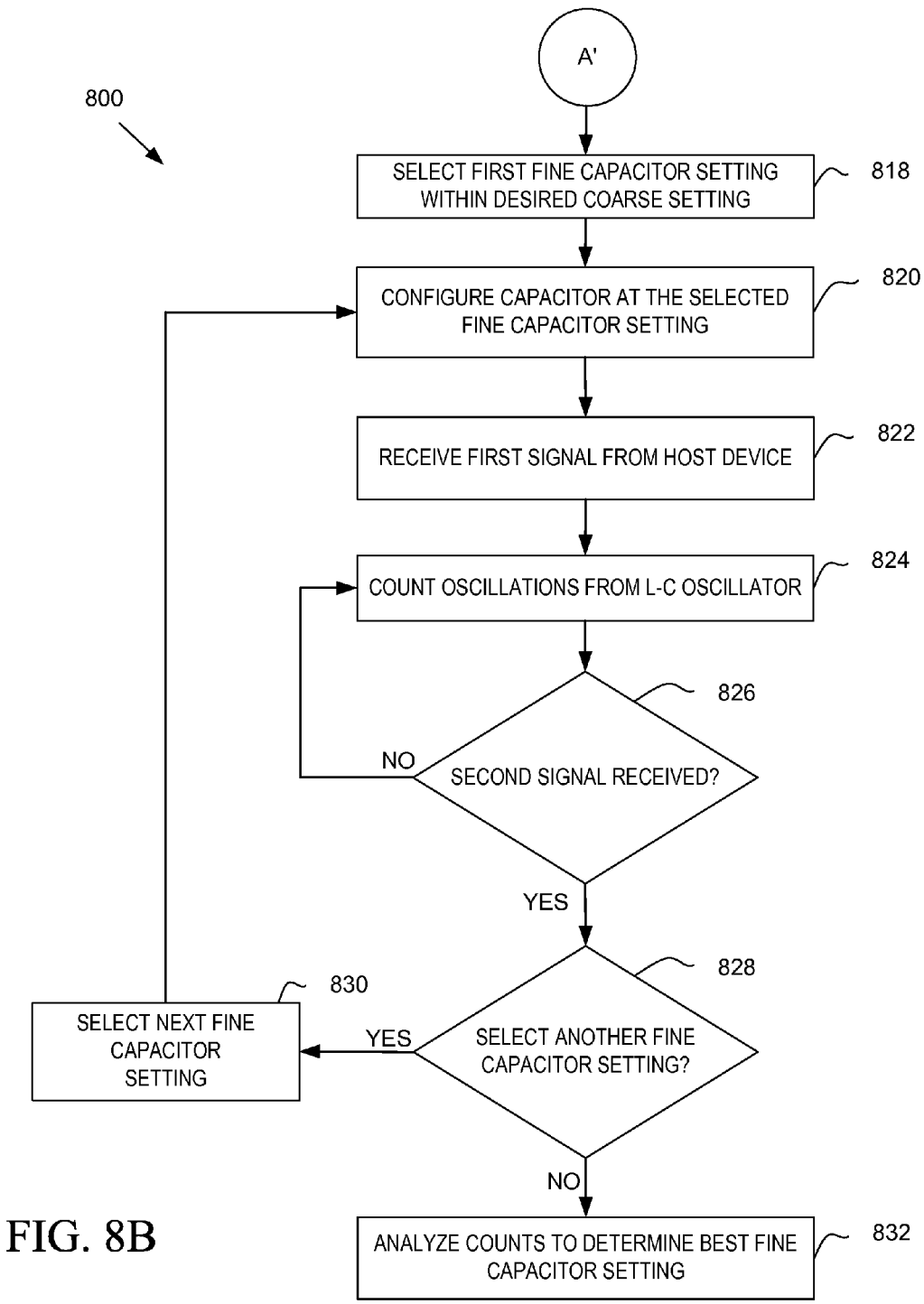

Further, the determination at 712 whether to select another capacitor setting may be performed in several ways. One way, as discussed in FIGS. 8A-B, is to select each of the coarse-tuned settings for testing in order to generate counts at each of the coarse-tuned settings. Then, the coarse-tuned setting that is closest to the number of oscillations expected at the desired frequency is selected for further analysis. Thereafter, the fine-tuned settings within the selected coarse-tuned setting are selected. Another way is to randomly select the variable capacitor settings. Other ways to select the capacitor settings are contemplated.

FIGS. 8A-B illustrate a second flow chart 800 for calibrating a capacitor-based oscillator. At 802, a first coarse-tuned capacitor setting is selected. As discussed above, the variable capacitor may have a plurality of coarse-tuned settings, with each setting resulting in a different frequency output from the oscillator. In one embodiment, each of the course-tuned capacitor settings may be tested. For example, for a selected course-tuned capacitor setting, the frequency band FB0 with mid-programming FB0$_{MID}$ (illustrated in FIG. 5) is selected and counting of the number of edges from first rising edge of SoF/ITP to another rising edge of SoF/ITP is performed.

In an alternative embodiment, less than all of the course-tuned capacitor settings may be tested. For example, a binary search algorithm may be used, described below, in order to determine which of the coarse-tuned capacitor settings to select.

At 804, the capacitor is configured at the selected setting. At 806, the first signal is received. At 808, the oscillations output from the oscillator are counted. At 810, it is determined if the second signal has been received. If not, the flow chart 800 loops back to 808. In this regard, the oscillations output from the oscillator are counted until the second signal is received.

At 812, it is determined whether there are other coarse-tuned capacitor settings to select. If so, at 814, the next coarse-tuned capacitor setting is selected and the flow chart 800 loops back to 804. FIGS. 4-5 illustrate 3 coarse-tuned capacitor settings. Other numbers of coarse-tuned capacitor settings are contemplated. If not, at 816, the counts as output by the oscillator configured in the different coarse-tuned capacitor settings are analyzed to determine which coarse-tuned capacitor setting is closest to the desired count. In the example above, if the desired frequency is 1 GHz and the number of oscillations that is expected to occur in the 125 µSec time period equals 125,000, the coarse-tuned capacitor setting whose oscillator output is closest to 125,000 is selected. In this regard, once the number of counts are determined, the correct coarse-tuned band is selected based upon which frequency band has least variation from the desired oscillator response with respect to the mid frequency (FB0$_{MID}$).

Using the selected coarse-tuned capacitor setting, the process is repeated for one, some, or all of the fine-tuned capacitor settings within the selected coarse-tuned capacitor setting. At 818, a first fine-tuned capacitor setting is selected. As discussed above, the variable capacitor may have a plurality of fine-tuned settings, with each setting resulting in a different frequency output from the oscillator.

The binary search algorithm may find the particular fine-tuned capacitor setting within the plurality of fine-tuned capacitor settings. In each step, the algorithm may compare the desired value of the number of counts with the number of counts of the middle element of the plurality of fine-tuned capacitor settings. If the counts match, then a desired fine-tuned capacitor setting has been found. Otherwise, if the number of counts is less than the desired value of the number of counts, then the algorithm may repeat its analysis on higher values of the fine-tuned capacitor settings. Or, if number of counts is greater than the desired value of the number of counts, then the algorithm may repeat its analysis on lower values of the fine-tuned capacitor settings. In this regard, the binary search may halve the number of items to check with each iteration, so locating the desired fine-tuned capacitor setting may take logarithmic time. This process of fine tune may necessitate an additional number of SoF/ITP equal to number of finer programming bits in frequency band. If the frequency band finer trimming is FB(N)_TRIM<6:0>, then the full process of band selection and tuning to right frequency may be completed in 3+7=10 SoF/ITP steps.

At 820, the capacitor is configured at the selected setting. At 822, the first signal is received. At 824, the oscillations output from the oscillator are counted. At 826, it is determined if the second signal has been received. If not, the flow chart 800 loops back to 824. In this regard, the oscillations output from the oscillator are counted until the second signal is received.

At 828, it is determined whether there are other fine-tuned capacitor settings to select. If so, at 830, the next fine-tuned capacitor setting is selected and the flow chart 800 loops back to 820. FIGS. 4-5 illustrate 128 fine-tuned capacitor settings. Other numbers of fine-tuned capacitor settings are contemplated. If not, at 832, the counts as output by the oscillator configured in the different fine-tuned capacitor settings are analyzed to determine which coarse-tuned capacitor setting is closest to the desired count. In the example above, if the desired frequency is 1 GHz and the number of oscillations that is expected to occur in the 125 µSec time period equals 125,000, the fine-tuned capacitor setting whose oscillator output is closest to 125,000 is selected.

As discussed above, different variables may affect the frequency generated by the oscillator. Examples include process conditions, temperature and voltage. Other variables are contemplated. In this regard, the oscillator may be calibrated for one, some, or every combination of variables. For example, the oscillator may be calibrated for process conditions. As another example, the oscillator may be calibrated for process conditions and temperature. More specifically, the temperature of the oscillator may adjusted (e.g., by heating) to various temperatures. At each of the various temperatures, the oscillator may be calibrated to determine the capacitor setting that generates the desired frequency at the specified temperature. As still another example, the oscillator may be calibrated for process conditions and voltage. More specifically, the peripheral device may include one or more voltage regulators, which modify the voltage received from the host device. Changes in the voltage output by the regulator may be on the order of 10-15 mV, resulting in changes to the frequency output by the oscillator. In this regard, calibration may comprise adjusting the voltage supplied to the oscillator to different values. At each of the different voltage values, the oscillator may be calibrated to determine the capacitor setting that generates the desired frequency at the specified voltage value.

The calibrations may be stored in a look-up table for future use. For example, during operation, the peripheral device may determine the current temperature (e.g., by a sensor positioned within the peripheral device or by requesting the temperature from the host device). The peripheral device may input the current temperature into the look-up table, and receive as an output the capacitor setting in order for the oscillator to generate the desired frequency. As another example, during operation, the peripheral device may determine the current voltage output by the regulator. The peripheral device may input the current voltage output by the regulator (and supplied to the oscillator) into the look-up table, and receive as an output the capacitor setting in order for the oscillator to generate the desired frequency.

Instructions for calibrating and operating the oscillator discussed above may be stored on any computer readable medium. As used herein, a "computer readable medium" includes, but is not limited to, non-volatile media, and volatile media. Non-volatile media may include, for example, optical disks, and magnetic disks. Volatile media may include, for example, semiconductor memories, and dynamic memory. The computer readable medium may be any non-transitory medium. Common forms of a computer readable medium may include, but are not limited to, a floppy disk, a flexible disk, a hard disk, a magnetic tape, other magnetic medium, an application specific integrated circuit (ASIC), a compact disk CD, other optical medium, a random access memory (RAM), a read only memory (ROM), a memory chip or card, a memory stick (e.g., flash memory), and other media from which a computer, a processor or other electronic device can read.

Instructions for controlling or commanding a device in the process discussed above, such as disclosed in FIGS. 7-8, may be stored on any logic. As used herein, "logic", includes but is not limited to hardware, firmware, software in execution on a machine, and/or combinations of each to perform a function(s) or an action(s), and/or to cause a function or action from another logic, method, and/or system. Logic may include, for example, a software-controlled microprocessor, an ASIC, an analog circuit, a digital circuit, a programmed logic device, and a memory device containing instructions.

Further, the illustrations described herein are intended to provide a general understanding of the structure of various embodiments, and the appended claims are intended to cover all such modifications, enhancements, and other embodiments, which fall within the true spirit and scope of the description. The illustrations are not intended to serve as a complete description of all of the elements and features of apparatus, processors, and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Accordingly, the disclosure and the figures are to be regarded as illustrative rather than restrictive.

What is claimed is:

1. A method for calibrating an oscillator in an electronic device, the electronic device configured to communicate with an external device via an interface, the oscillator configurable to a plurality of coarse-tuned settings and a plurality of fine-tuned settings, each of the plurality of coarse-tuned settings and the plurality of fine-tuned settings resulting in a different frequency output by the oscillator, the method comprising:
   iteratively performing for the plurality of coarse-tuned settings:
      configuring the oscillator to a respective coarse-tuned setting;
      receiving a first signal indicative of a periodic signal from the electronic device via the interface;
      receiving a second signal indicative of the periodic signal from the electronic device via the interface; and
      determining a number of cycles output from the oscillator at the respective coarse-tuned setting in between when the first signal was received and the second signal was received;
   selecting one of the plurality of coarse-tuned settings to configure the oscillator based on the determined number of cycles output from the oscillator at the respective coarse-tuned settings;
   iteratively performing for the plurality of fine-tuned settings within the selected one of plurality of coarse-tuned capacitor settings:
      configuring the oscillator to a respective fine-tuned setting;
      receiving a third signal indicative of the periodic signal from the electronic device via the interface;
      receiving a fourth signal indicative of the periodic signal from the electronic device via the interface; and
      determining a number of cycles output from the oscillator at the respective fine-tuned setting in between when the third signal was received and the fourth signal was received;
   selecting one of the plurality of fine-tuned settings within the selected one of plurality of coarse-tuned capacitor to configure the oscillator based on the determined number of cycles output from the oscillator at the respective fine-tuned settings.

2. The method of claim 1, wherein the electronic device is a peripheral device; and
   wherein the external device is a host device, the peripheral device removably connected to the host device via the interface.

3. The method of claim 2, wherein the peripheral device is a storage device;
   wherein the interface is a USB interface; and
   wherein the first signal, the second signal, the third signal, and the fourth signal are Start of Frame (SoF) signals.

4. The method of claim 1, wherein the second signal is a next successive SoF signal after receipt of the first signal.

5. The method of claim 1, wherein the oscillator comprises an L-C oscillator.

6. The method of claim 5, wherein, for iteratively performing for the plurality of coarse-tuned settings, determining the number of cycles output from the oscillator comprises, after receiving the first signal, comprises counting the number of cycles of the L-C oscillator until receipt of the second signal.

7. The method of claim 1, wherein selecting one of the plurality of coarse-tuned settings to configure the oscillator based on the determined number of cycles output from the oscillator at the respective coarse-tuned settings comprises:
   accessing a desired number of cycles in a memory in the electronic device, the desired number of cycles indicative of a number of cycles at a desired frequency;
   comparing the determined number of cycles from the oscillator at the respective coarse-tuned settings with the desired number of cycles; and
   selecting the one of the plurality of coarse-tuned settings based on the comparison,
   wherein selecting one of the plurality of fine-tuned settings within the selected one of plurality of coarse-tuned capacitor settings to configure the oscillator based on the determined number of cycles output from the oscillator at the respective fine-tuned settings comprises:
      comparing the determined number of cycles from the oscillator at the respective fine-tuned settings within the selected one of plurality of coarse-tuned capacitor settings with the desired number of cycles; and
      selecting the one of the plurality of fine-tuned settings within the selected one of plurality of coarse-tuned capacitor settings based on the comparison.

8. The method of claim 1, wherein the oscillator comprises a capacitor-based oscillator.

9. The method of claim 8, wherein, for iteratively performing for the plurality of coarse-tuned settings, selecting one of the plurality of coarse-tuned capacitor settings comprises:
   comparing the number of cycles output from the oscillator at each of the plurality of coarse-tuned capacitor settings with a desired number of cycles in a memory in the electronic device, the desired number of cycles indicative of a number of cycles at a desired frequency;
   selecting one of the plurality of coarse-tuned capacitor settings that has the number of cycles closest to the desired number of cycles;
   wherein for iteratively performing for the plurality of fine-tuned settings, selecting one of the plurality of fine-tuned capacitor settings within the selected one of plurality of coarse-tuned capacitor settings comprises:
   comparing the number of cycles output from the oscillator at each of the plurality of fine-tuned capacitor settings with the desired number of cycles;
   selecting one of the plurality of fine-tuned capacitor settings that has the number of cycles closest to the desired number of cycles.

10. The method of claim 1, wherein iteratively performing for the plurality of coarse-tuned settings and for the plurality of fine-tuned settings comprises iteratively performing for the plurality of coarse-tuned settings and for the plurality of fine-tuned settings at a plurality of different temperatures;
   wherein selecting one of the plurality of coarse-tuned settings and fine-tuned settings to configure the oscillator based on the determined number of cycles output from the oscillator at the respective coarse-tuned settings and fine-tuned settings comprises selecting, for each of the plurality of different temperatures, a correlated coarse-tuned setting and fine-tuned setting to configure the oscillator; and
   further comprising storing in a look-up table each of the plurality of different temperatures correlated to a correlated coarse-tuned setting and fine-tuned setting to configure the oscillator.

11. An electronic device comprising:
   an interface configured to communicate with an external device;
   an oscillator configurable to a plurality of settings, each of the settings resulting in a different frequency output by the oscillator; and
   a controller in communication with the interface and the oscillator, the controller configured to:
      iteratively perform for the plurality of coarse-tuned settings:
         configure the oscillator to a respective coarse-tuned setting;
         receive a first signal indicative of a periodic signal from the electronic device via the interface;
         receive a second signal indicative of the periodic signal from the electronic device via the interface; and
         determine a number of cycles output from the oscillator at the respective coarse-tuned setting in between when the first signal was received and the second signal was received;
      select one of the plurality of coarse-tuned settings to configure the oscillator based on the determined number of cycles output from the oscillator at the respective coarse-tuned settings;
      iteratively perform for the plurality of fine-tuned settings within the selected one of plurality of coarse-tuned capacitor settings:
         configure the oscillator to a respective fine-tuned setting;
         receive a third signal indicative of the periodic signal from the electronic device via the interface;
         receive a fourth signal indicative of the periodic signal from the electronic device via the interface; and
         determine a number of cycles output from the oscillator at the respective fine-tuned setting in between when the third signal was received and the fourth signal was received;
      select one of the plurality of fine-tuned settings within the selected one of plurality of coarse-tuned capacitor to configure the oscillator based on the determined number of cycles output from the oscillator at the respective fine-tuned settings.

12. The electronic device of claim 11, wherein the electronic device is a peripheral device; and
   wherein the external device is a host device, the peripheral device removably connected to the host device via the interface.

13. The electronic device of claim 12, wherein the peripheral device is a storage device;
   wherein the interface is a USB interface; and
   wherein the first signal, the second signal, the third signal, and the fourth signal are Start of Frame (SoF) signals.

14. The electronic device of claim 11, wherein the second signal is a next successive SoF signal after receipt of the first signal.

15. The electronic device of claim 11, wherein the oscillator comprises an L-C oscillator.

16. The electronic device of claim 15, wherein, for iteratively performing for the plurality of coarse-tuned settings, the controller is configured to determine the number of cycles output from the oscillator by, after receiving the first signal, by counting the number of cycles of the L-C oscillator until receipt of the second signal.

17. The electronic device of claim 11, wherein the controller is configured to select one of the plurality of coarse-tuned settings to configure the oscillator based on the determined number of cycles output from the oscillator at the respective coarse-tuned settings by:
  accessing a desired number of cycles in a memory in the electronic device, the desired number of cycles indicative of a number of cycles at a desired frequency;
  comparing the determined number of cycles from the oscillator at the respective coarse-tuned settings with the desired number of cycles; and
  selecting the one of the plurality of coarse-tuned settings based on the comparison,
  wherein the controller is configured to select one of the plurality of fine-tuned settings within the selected one of plurality of coarse-tuned capacitor settings to configure the oscillator based on the determined number of cycles output from the oscillator at the respective fine-tuned settings by:
    comparing the determined number of cycles from the oscillator at the respective fine-tuned settings within the selected one of plurality of coarse-tuned capacitor settings with the desired number of cycles; and
    selecting the one of the plurality of fine-tuned settings within the selected one of plurality of coarse-tuned capacitor settings based on the comparison.

18. The electronic device of claim 11, wherein the oscillator comprises a capacitor-based oscillator.

19. The electronic device of claim 18, wherein, for iteratively performing for the plurality of coarse-tuned settings, the controller is configured to select one of the plurality of coarse-tuned capacitor settings by:
  comparing the number of cycles output from the oscillator at each of the plurality of coarse-tuned capacitor settings with a desired number of cycles in a memory in the electronic device, the desired number of cycles indicative of a number of cycles at a desired frequency;
  selecting one of the plurality of coarse-tuned capacitor settings that has the number of cycles closest to the desired number of cycles; and
  wherein, for iteratively performing for the plurality of fine-tuned settings, the controller is configured to select one of the plurality of fine-tuned capacitor settings within the selected one of plurality of coarse-tuned capacitor settings by:
    comparing the number of cycles output from the oscillator at each of the plurality of fine-tuned capacitor settings with the desired number of cycles;
    selecting one of the plurality of fine-tuned capacitor settings that has the number of cycles closest to the desired number of cycles.

20. The electronic device of claim 11, further comprising a memory;
  wherein the controller is configured to iteratively perform for the plurality of coarse-tuned settings and for the plurality of fine-tuned settings by iteratively performing for the plurality of coarse-tuned settings and for the plurality of fine-tuned settings at a plurality of different temperatures;
  wherein the controller is configured to select one of the plurality of coarse-tuned settings and fine-tuned settings to configure the oscillator based on the determined number of cycles output from the oscillator at the respective coarse-tuned settings and fine-tuned settings by selecting, for each of the plurality of different temperatures, a correlated coarse-tuned setting and fine-tuned setting to configure the oscillator; and
  wherein the controller is further configured to store in the memory each of the plurality of different temperatures correlated to a correlated coarse-tuned setting and fine-tuned setting to configure the oscillator.

* * * * *